United States Patent [19]

Gotou et al.

[11] Patent Number: 5,226,015
[45] Date of Patent: Jul. 6, 1993

[54] SEMICONDUCTOR MEMORY SYSTEM

[75] Inventors: Masaji Gotou, Fujisawa; Hidehito Usui, Chigasaki; Hitoshi Kondo, Yokohama, all of Japan

[73] Assignee: Kabushiki Kaisha Toshiba, Kawasaki, Japan

[21] Appl. No.: 705,924

[22] Filed: May 28, 1991

[30] Foreign Application Priority Data

May 28, 1990 [JP] Japan .................................. 2-135458

[51] Int. Cl.⁵ ............................................. G11C 13/00
[52] U.S. Cl. .......................... 365/230.01; 365/230.03; 365/189.01
[58] Field of Search ...................... 365/230.01, 230.03, 365/185.01

[56] References Cited

U.S. PATENT DOCUMENTS

| | | | |
|---|---|---|---|
| 4,752,915 | 6/1988 | Suzuki et al. | 365/230.03 |
| 4,800,535 | 1/1989 | McAlpine | 365/230.03 |
| 4,881,206 | 11/1989 | Kadono | 365/230.03 |
| 5,058,076 | 10/1991 | Kiuchi | 365/230.01 |
| 5,119,331 | 6/1992 | Sussman | 365/230.01 |

Primary Examiner—William L. Sikes
Assistant Examiner—Scott A. Ouellette
Attorney, Agent, or Firm—Foley & Lardner

[57] ABSTRACT

A programmable semiconductor memory system employs an EPROM. The system holds the start and end addresses of each write operation to completely use a data storage region of the EPROM with no redundancy and with no limitation on the quantity of data to be written if the quantity is within the capacity of the EPROM.

4 Claims, 3 Drawing Sheets

SEMICONDUCTOR MEMORY SYSTEM

BACKGROUND OF THE INVENTION

1. Field of the Invention

The present invention relates to a semiconductor memory system, and particularly to a programmable semiconductor memory system employing an EPROM.

2. Description of the Prior Art

Nonvolatile read only memories (ROMs) are classified into mask ROMs, EPROMs, and EEPROMs depending on their data writing methods. The mask ROMs have a large capacity and are inexpensive but not programmable. The EPROMs are programmable but, to program them, must once be removed from boards and irradiated with ultraviolet rays, thereby taking labor and time, and increasing costs. The EEPROMs are electrically erasable and programmable but expensive.

FIG. 1 shows a conventional memory system used for storing a machine control program, a password, etc., which are seldom rewritten. This system comprises an EPROM 1 of 8 kilowords (1024 words×8) divided into eight banks each with one kiloword so that the system may be rewritten (reprogrammed) seven times. The eight banks are switched from one to another through a bank switching block 3. The block 3 receives an address signal of 10 bits of A0 to A9 for addressing one of the one-kiloword memory banks, and adds a three-bit signal which indicates the number of write operations to the upper part of the address signal. According to the address signal, a write controller 5 writes data into the addressed bank of the EPROM 1.

The EPROM 1 has a one-word register for storing the number of write operations. Whenever data is written into the EPROM 1, "1" is set in the one-word register sequentially from a lower bit thereof, and the number of write operations is transferred to the bank switching block 3 through the controller 5 and stored in a three-bit register of the block 3. The three bits are added as upper bits of an address, thereby switching the banks of the EPROM 1 from one to another where data is to be written.

This system cannot efficiently use the EPROM. Firstly because each memory bank has the fixed capacity of one kiloword. If data to be stored in one bank is of 500 words for example, the remaining 524 words of the bank will be unused. In view of the capacity of eight kilowords, the EPROM is capable of being rewritten 15 times for the data of 500 words. Actually, however, the EPROM can be rewritten only seven times to leave more than half the memory unused. In addition, the EPROM has a limit on the maximum size of data to be written at one time. If data is greater than one kiloword, the EPROM cannot hold it. This limit on a single write operation must have, therefore, a margin, which further increases redundant memory regions.

SUMMARY OF THE INVENTION

An object of the invention is to provide an inexpensive programmable semiconductor memory system.

Another object of the invention is to provide a semiconductor memory system which can efficiently use the data region of an EPROM.

Still another object of the invention is to provide a semiconductor memory system which can write or rewrite data of optional quantity within a limit of the data region of an EPROM.

In order to accomplish the objects, the present invention provides a semiconductor memory system comprising a region for storing the number of write operations done on an EPROM, and a region for storing write start and end addresses for every write operation. A write operation is carried out for an address next to the previous write end address.

The semiconductor memory system of the invention leaves no unused memory region in the EPROM after write operations, and can completely use the memory region of the EPROM irrespective of the quantity of data of each write operation.

DETAILED DESCRIPTION OF THE EMBODIMENTS

Figure 1:
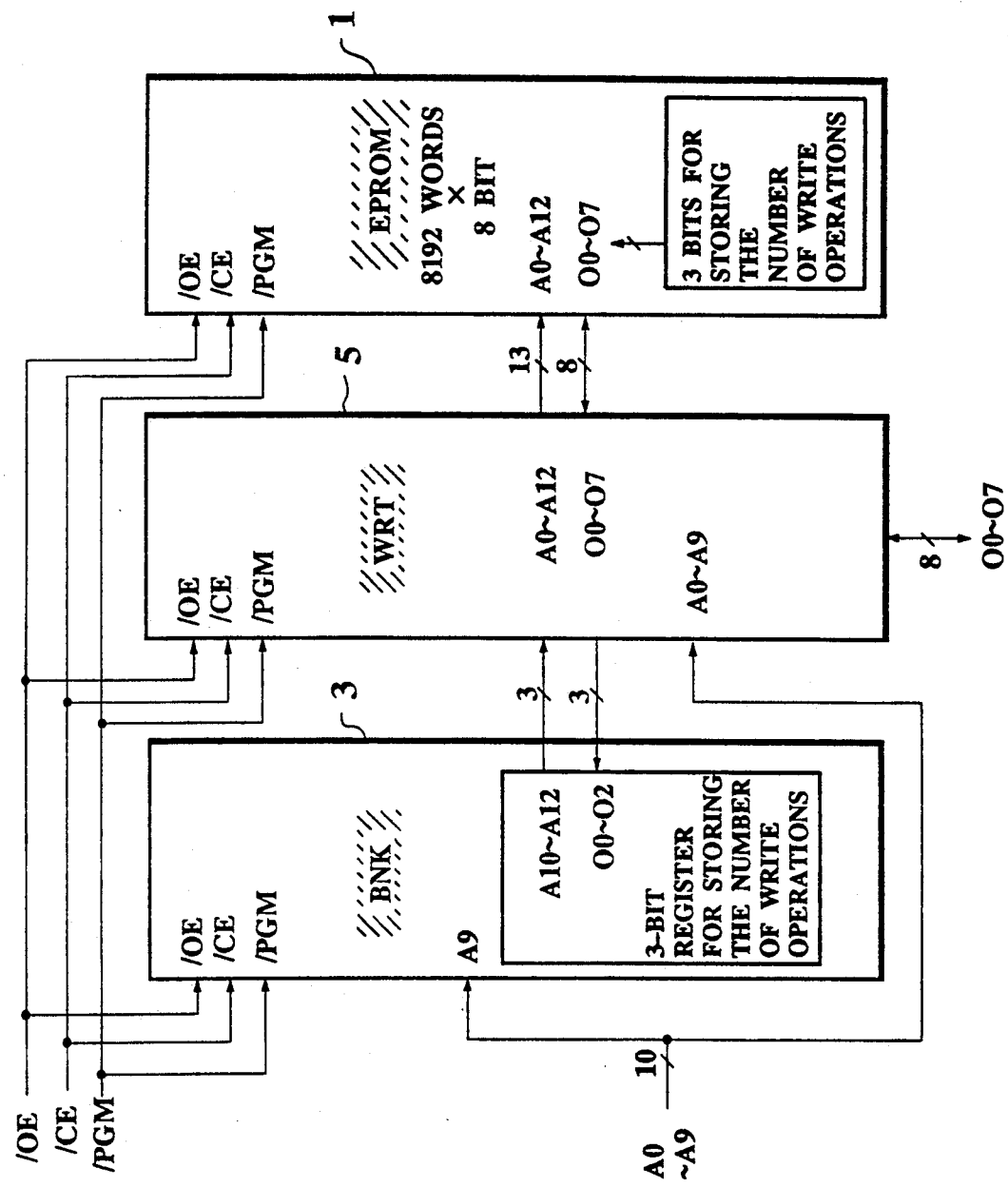
FIG. 1 is a block diagram showing a semiconductor memory system employing an EPROM, according to a prior art.
Figure 2:
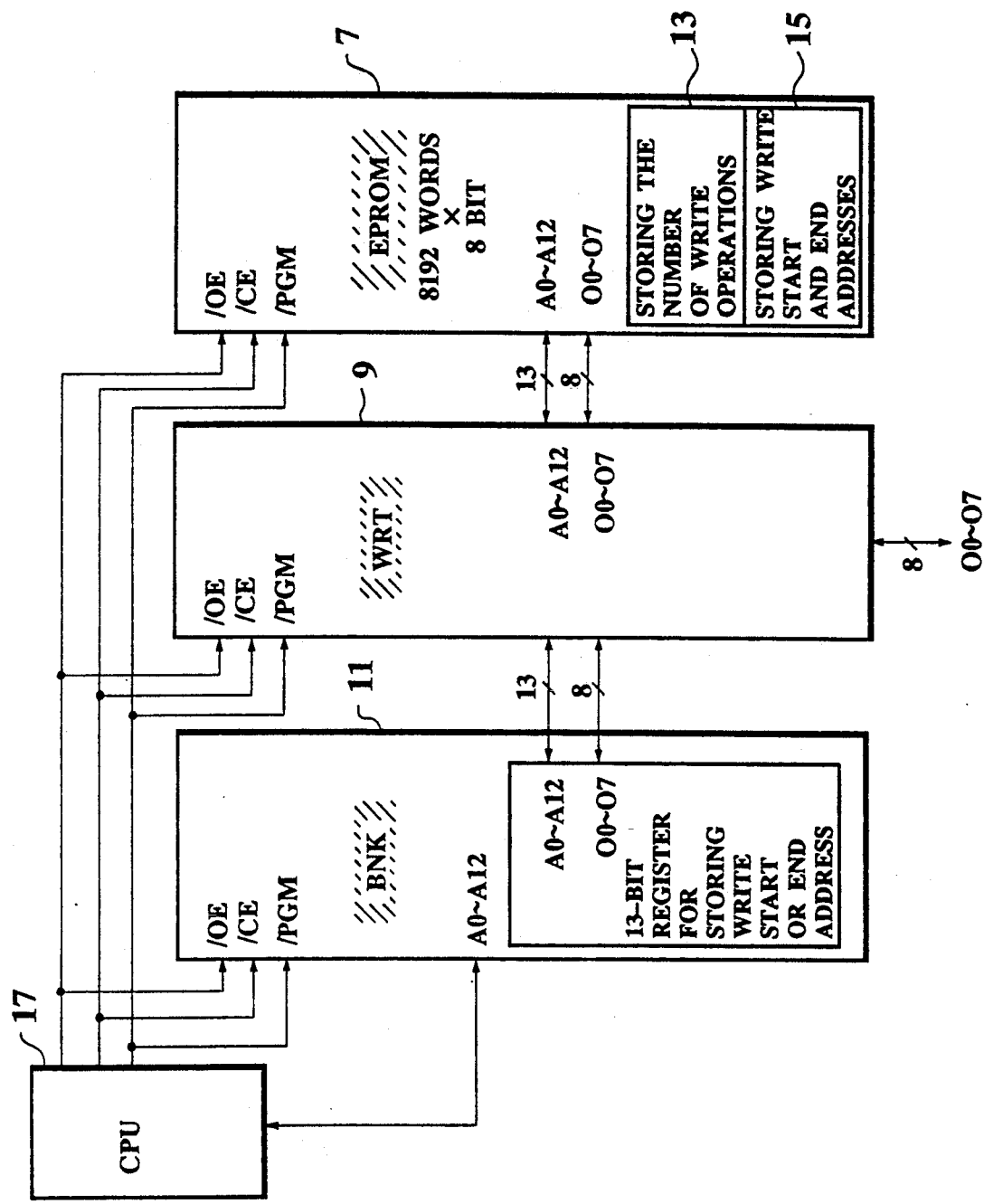
FIG. 2 is a block diagram showing a semiconductor memory system employing an EPROM, according to an embodiment of the invention.

FIG. 2 shows a semiconductor memory system according to an embodiment of the invention. This system comprises an EPROM 7, a write controller 9, and a bank switching controller 11. The EPROM 7 has a data storage region of 8192 words, a number storage region 13 of 13 words for storing the number of write operations, and a start/end addresses storage region 15 of 208 words for storing write start and end addresses. Here, each word comprises eight bits.

The number storage region 13 sequentially writes "1" into the 104 bits whenever data is written into the EPROM 7, so that, after 104 times of write operations, every bit of the number storage region 13 may have "1".

The start/end addresses storage region 15 has a capacity of 208 words which corresponds to 104 times of write operations, because two words are required each time for addressing 8192 words. A write start address is stored as it is while a write end address is stored after adding "1" to the address.

According to an address of 13 bits from the bank switching controller 11, the write controller 9 writes data into the EPROM 7. The write controller 9 receives a 7-bit signal indicating the number of write operations from the EPROM 7, as well as the previous write start or end address from the EPROM 7 according to the 7-bit signal, and transfers the received signals to the bank switching controller 11. Whenever data is written into the EPROM 7, the write controller 9 writes "1" into the number storage region 13 of the EPROM 7.

To read data out of the EPROM 7, the bank switching controller 11 provides a CPU 17 with start address information read out of the EPROM 7. The CPU 17 computes an address composed of bits A0 to A12 with the provided start address information as head address bits, and sends the address to the bank switching controller 11.

To rewrite the EPROM 7, the CPU 17 is provided with write end address plus one, and with this address as a head, writes (rewrites) the EPROM 7. Reference marks /OE, CE, and /PGM denote an output control line, a chip selection line, and a program control line, respectively.

The rewriting operation of the system will be explained more precisely.

Initially, all the storage regions including the number storage region 13 for storing the number of write operations and the start/end addresses storage region 15 have "0" each, so that a start address will be 0000H. Supposing data of 1024 words is to be written, 0000H is written into first two words of a write start address section and 0400H into first two words of a write end address section of the start/end addresses storage region 15. At the same time, "1" is written into a lowest bit of the number storage region 13 for storing the number of write operations.

For a second write operation, the write controller 9 reads the contents of the number storage region 13 for storing the number of write operations, reads the previous write end address 0400H according to the read number, adds "1" to the read address to obtain a start address 0401H for the second write operation, and transfers the start address to the bank switching controller 11, which stores the start address. With the address 0401H as a head address, the CPU 17 provides the bank switching controller 11 with a write address composed of bits A0 to A12. The write controller 9 receives the write address from the bank switching controller 11 and writes data into the EPROM 7. After the data is written, the write start address and the write end address plus 1 are stored in the start/end addresses storage region 15.

At this time, it is checked to see whether or not the write end address is greater than a maximum address 1FFFH of the EPROM. If it is greater, an error signal is generated. If it is not greater, "1" is written into a second lowest bit of the number storage region 13 for storing the number of write operations. The third and following write operations will be done in the same manner.

Figure 3:
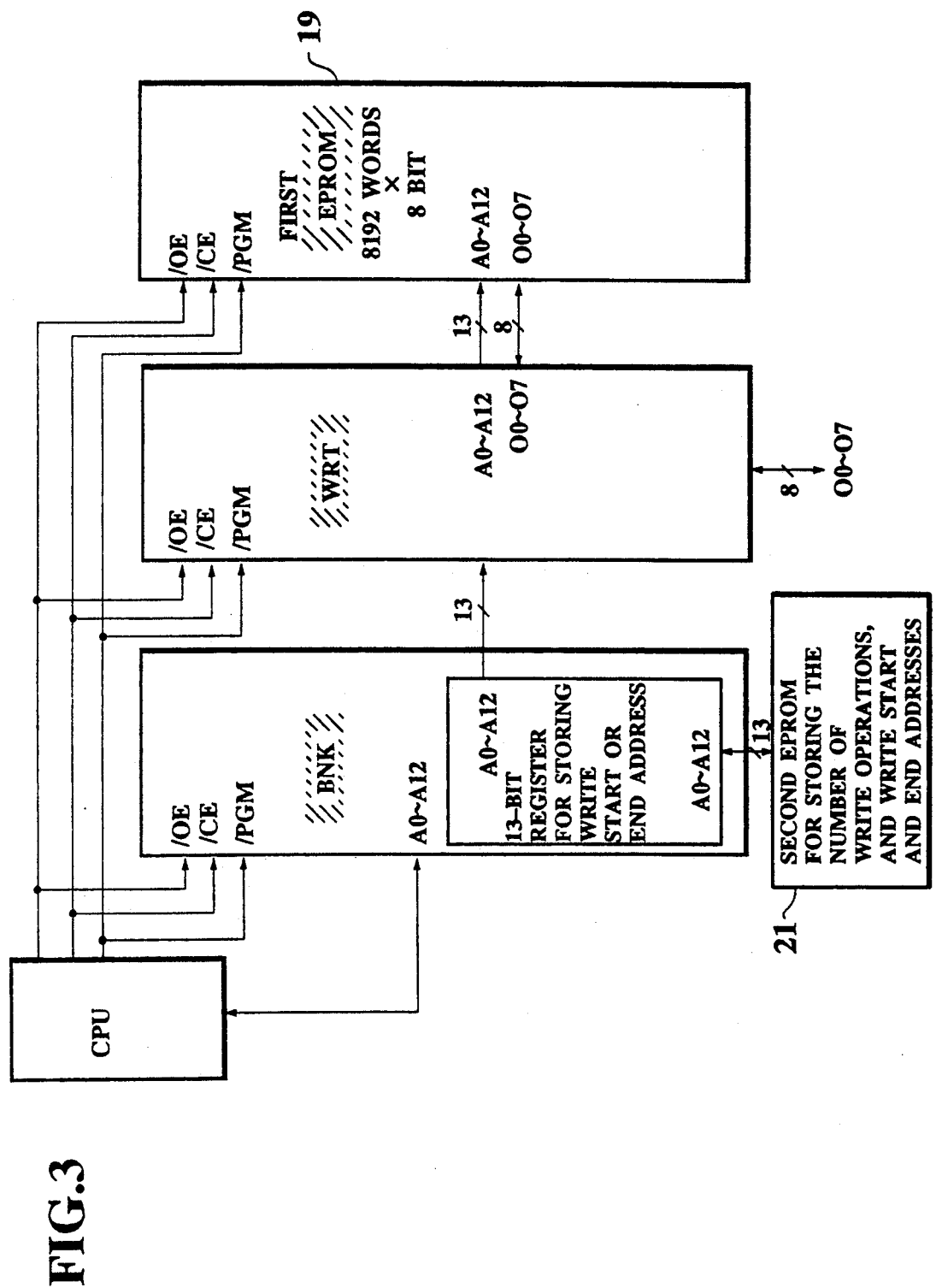
FIG. 3 is a block diagram showing a modification of the embodiment of FIG. 2.

The EPROM 7 and controllers 9 and 11 may be assembled in a single chip, or separate chips. As shown in FIG. 3, an EPROM 19 having only a data storage region may be employed with a number storage region for storing the number of write operations and a start/end addresses storage region for storing write start and end addresses being disposed in a separate EPROM 21. In addition, various modifications will become possible for those skilled in the art after receiving the teachings of the present disclosure without departing from the scope thereof.

In summary, the present invention provides a semiconductor memory system which can rewrite an EPROM until a data storage region of the EPROM is completely used, irrespective of the quantity of write data of each write operation, thereby increasing the number of write operations. The quantity of write data of each write operation is optional if it is within the capacity of the data storage region, thereby broadening the application of the semiconductor memory system.

Various modification will become possible for those skilled in the art after receiving the teachings of the present disclosure without departing from the scope thereof.

What is claimed is:

1. A semiconductor memory system comprising:
   a data storage region of an EPROM;
   a write controller for writing data into a part of said data storage region;
   a number storage region of the EPROM, for storing the number of write operations done by said write controller;
   an address storage region of the EPROM, for separately storing a write start address and a write end address of said data storage region for each write operation; and
   a bank switching controller for holding, as an address, a write start address stored in said address storage region and corresponding to the number stored in said number storage region, at a start of reading data out of said data storage region, and holding, as an address, an address next to a write end address stored in said address storage region and corresponding to the number stored in said number storage region, in writing data into said data storage region.

2. The semiconductor storage system according to claim 1, wherein said data storage region, said number storage region and address storage region, said write controller, and said bank switching controller are formed on separate chips, respectively.

3. The semiconductor memory system according to claim 1, wherein said number storage region and address storage region are formed on a chip which is different from a chip where said data storage region is formed.

4. The semiconductor memory system according to claim 1, wherein said data storage region, number storage region, address storage region, write controler, and bank switching controller are integrally formed on a single semiconductor chip.

* * * * *